(12) United States Patent
Cui et al.

(10) Patent No.: US 11,362,155 B2
(45) Date of Patent: Jun. 14, 2022

(54) DISPLAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Ying Cui, Beijing (CN); Wei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 175 days.

(21) Appl. No.: 16/621,933

(22) PCT Filed: Jan. 28, 2019

(86) PCT No.: PCT/CN2019/073406
§ 371 (c)(1),
(2) Date: Dec. 12, 2019

(87) PCT Pub. No.: WO2020/001020
PCT Pub. Date: Jan. 2, 2020

(65) Prior Publication Data
US 2021/0296414 A1   Sep. 23, 2021

(30) Foreign Application Priority Data
Jun. 25, 2018   (CN) .......................... 201810662016.7

(51) Int. Cl.
*H01L 27/32* (2006.01)
(52) U.S. Cl.
CPC ...... *H01L 27/3246* (2013.01); *H01L 27/3276* (2013.01); *H01L 2227/323* (2013.01)
(58) Field of Classification Search
CPC ............. H01L 27/3246; H01L 27/3276; H01L 2227/323
(Continued)

(56) References Cited

U.S. PATENT DOCUMENTS 8,415,675 B2   4/2013   Im et al.
9,099,415 B2   8/2015   Park
(Continued)

FOREIGN PATENT DOCUMENTS

CN   101114668 A   1/2008
CN   104659059 A   5/2015
CN   108831916 A   11/2018

OTHER PUBLICATIONS

First Office Action dated Jun. 5, 2019 for corresponding Chinese application 201810662016.7.
(Continued)

*Primary Examiner* — Dzung Tran
(74) *Attorney, Agent, or Firm* — Nath, Goldberg & Meyer; Joshua B. Goldberg

(57) ABSTRACT

A display substrate includes a substrate; a first pixel defining layer on the substrate, wherein the first pixel defining layer has a first container portion therein; a planarization pattern filled in the first container portion, wherein a surface of the planarization pattern distal to the substrate is flush with a surface of the first pixel defining layer distal to the substrate; a second pixel defining layer on a side of the planarization pattern distal to the substrate, wherein a second container portion is in the second pixel defining layer and penetrates through the second pixel defining layer along a stacking direction of the first pixel defining layer and the substrate, and an orthographic projection of the second container portion on the substrate falls within an orthographic projection of the first container portion on the substrate; and an organic functional layer in the second container portion.

11 Claims, 2 Drawing Sheets

(58) Field of Classification Search
USPC .......................................................... 257/40
See application file for complete search history.

(56) References Cited

U.S. PATENT DOCUMENTS

| | | | |
|---|---|---|---|
| 9,318,543 B2 | 4/2016 | Lee et al. | |
| 2005/0082534 A1* | 4/2005 | Kim | H01L 51/5215 |
| | | | 257/72 |
| 2008/0122347 A1* | 5/2008 | Lee | H01L 27/3244 |
| | | | 313/504 |
| 2010/0193790 A1* | 8/2010 | Yeo | H01L 29/4908 |
| | | | 257/59 |
| 2011/0108877 A1* | 5/2011 | Yamada | H01L 51/5203 |
| | | | 257/99 |
| 2011/0175095 A1 | 7/2011 | Kang et al. | |
| 2013/0057143 A1* | 3/2013 | Sugimoto | H01L 51/5228 |
| | | | 313/512 |
| 2013/0328479 A1* | 12/2013 | Jung | G02B 27/0006 |
| | | | 313/504 |

OTHER PUBLICATIONS

Second Office Action dated Jan. 20, 2020 for corresponding Chinese application 201810662016.7.

* cited by examiner

DISPLAY SUBSTRATE, MANUFACTURING METHOD THEREOF AND DISPLAY DEVICE

CROSS REFERENCE TO RELATED APPLICATIONS

This is a National Phase Application filed under 35 U.S.C. 371 as a national stage of PCT/CN2019/073406, filed on Jan. 28, 2019, an application claiming the priority of Chinese patent application No. 201810662016.7, filed on Jun. 25, 2018, the present disclosure of each of which is incorporated herein in its entirety by reference.

TECHNICAL FIELD

The present disclosure relates to the field of display technology, and particularly relates to a display substrate, a manufacturing method thereof, and a display device.

BACKGROUND

In the field of manufacturing an organic light emitting diode (OLED), an inkjet printing technology is widely used due to its advantages of simple operation, low cost, simple process, making it easy to realize a large size product, and the like.

SUMMARY

Embodiments of the present disclosure provide a display substrate, a manufacturing method thereof, and a display device.

Some embodiments of the present disclosure provide a display substrate, including:

a substrate;

a first pixel defining layer on the substrate, wherein the first pixel defining layer has a first container portion therein;

a planarization pattern filled in the first container portion, wherein a surface of the planarization pattern distal to the substrate is flush with a surface of the first pixel defining layer distal to the substrate;

a second pixel defining layer on a side of the planarization pattern distal to the substrate, wherein a second container portion is in the second pixel defining layer and penetrates through the second pixel defining layer along a stacking direction of the first pixel defining layer and the substrate, and an orthographic projection of the second container portion on the substrate falls within an orthographic projection of the first container portion on the substrate; and an organic functional layer in the second container portion.

In an embodiment, the display substrate further includes a first electrode between the planarization pattern and the organic functional layer, wherein the first electrode covers the planarization pattern.

In an embodiment, the display substrate further includes a first planarization layer, wherein the first planarization layer is provided at a side of the first pixel defining layer proximal to the substrate and in contact with the first pixel defining layer.

In an embodiment, an orthographic projection of the first pixel defining layer on the substrate falls within an orthographic projection of the first planarization layer on the substrate.

In an embodiment, the display substrate further includes a second electrode on a side of the organic functional layer distal to the substrate.

In an embodiment, the display substrate includes an OLED substrate, the first electrode is a reflective electrode, and the second electrode is a transmissive electrode.

In an embodiment, the display substrate further includes a thin film transistor between the substrate and the first pixel defining layer, wherein an orthographic projection of a region where the thin film transistor is located on the substrate at least partially overlaps an orthographic projection of a region where the first electrode, the second electrode, and the organic functional layer are located on the substrate.

In an embodiment, the first container portion is a first via penetrating through the first pixel defining layer along the stacking direction of the first pixel defining layer and the substrate.

In an embodiment, the second container portion is a second via penetrating through the second pixel defining layer along the stacking direction of the first pixel defining layer and the substrate.

In an embodiment, the display substrate further includes a first planarization layer, wherein the first planarization layer is provided at a side of the first pixel defining layer proximal to the substrate and in contact with the first pixel defining layer; and the thin film transistor includes an active layer on the substrate and a source electrode and a drain electrode on the active layer, and the first electrode is connected to the drain electrode through a third via penetrating through the first pixel defining layer and the first planarization layer along the stacking direction of the first pixel defining layer and the substrate.

Some embodiments of the present disclosure provide a display device including the display substrate of any one of the above embodiments of the present disclosure.

Some embodiments of the present disclosure provide a method for manufacturing a display substrate, including steps of:

forming a first pixel defining layer on a substrate by a patterning process, wherein the first pixel defining layer has a first container portion therein;

forming a planarization pattern filled in the first container portion, wherein a surface of the planarization pattern distal to the substrate is flush with a surface of the first pixel defining layer distal to the substrate;

forming a second pixel defining layer by a patterning process, wherein a second container portion is disposed in the second pixel defining layer and penetrates through the second pixel defining layer along a stacking direction of the first pixel defining layer and the substrate, and an orthogonal projection of the second container portion on the substrate falls within an orthogonal projection of the first container portion on the substrate; and forming an organic functional layer at least in the second container portion.

In an embodiment, prior to the step of forming a second pixel defining layer, the method further includes a step of:

forming a first electrode on the planarization pattern, wherein the first electrode covers the planarization pattern.

In an embodiment, prior to the step of forming a first pixel defining layer, the method further includes a step of:

forming a first planarization layer on the substrate, wherein a side of the first pixel defining layer proximal to the substrate is in contact with the first planarization layer.

In an embodiment, the step of forming a planarization pattern filled in the first container portion includes steps of:

forming a second planarization layer on a side of the first pixel defining layer distal to the substrate; and scraping the second planarization layer to form the planarization pattern only in the first container portion.

In an embodiment, after the step of forming an organic functional layer at least in the second container portion, the method further includes a step of:

forming a second electrode on a side of the organic functional layer distal to the substrate.

In an embodiment, the display substrate includes an OLED substrate, and prior to the step of forming a first pixel defining layer, the method further includes a step of:

forming layer structures including a thin film transistor on the substrate, wherein an orthographic projection of a region where the thin film transistor is located on the substrate at least partially overlap an orthographic projection of a region where the first electrode, the second electrode and the organic functional layer are located on the substrate.

In an embodiment, the organic functional layer is formed by inkjet printing.

In an embodiment, the first container portion is formed by forming a first via penetrating through the first pixel defining layer along the stacking direction of the first pixel defining layer and the substrate, and the second container portion is formed by forming a second via penetrating through the second pixel defining layer along the stacking direction of the first pixel defining layer and the substrate.

In an embodiment, prior to the step of forming a first pixel defining layer, the method further includes a step of:

forming a first planarization layer on the substrate, wherein a side of the first pixel defining layer proximal to the substrate is in contact with the first planarization layer; and the step of forming layer structures including a thin film transistor on the substrate includes steps of:

forming an active layer on the substrate; and forming a source electrode and a drain electrode on the active layer such that the first electrode is connected to the drain electrode through a third via penetrating through the first pixel defining layer and the first planarization layer along the stacking direction of the first pixel defining layer and the substrate.

DETAILED DESCRIPTION

Figure 1:
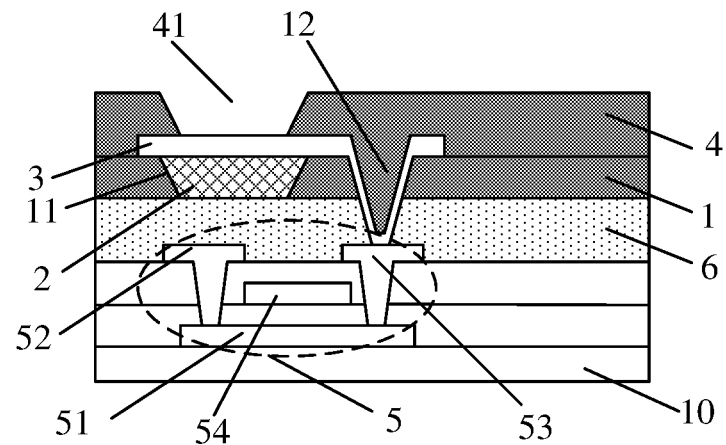
FIG. 1 is a schematic structural diagram of a display substrate according to an embodiment of the present disclosure.

To enable one of ordinary skill in the art to better understand the technical solutions of the present disclosure, the present disclosure will be described in detail below with reference to exemplary embodiments and the accompanying drawings.

The inventors of the present disclosure have found that although the above ink jet printing technology has the advantages as described above, it has some disadvantages. For example, in a case where a top emission type OLED device (i.e., an OLED device emitting light from the top thereof) is manufactured by using the inkjet printing technology, since a driving element (e.g., a thin film transistor (TFT)) is disposed on a substrate within a pixel, an upper surface of a film layer on the substrate within the pixel may be uneven. When inkjet printing is performed to form an organic functional layer (e.g., a light emitting layer, a hole injection layer, a hole transport layer, an electron injection layer, and/or an electron transport layer) of the OLED device, due to the fluidity of the ink used for forming the organic functional layer, a relatively low portion of the bottom surface of a container portion, in which the organic functional layer is to be formed, in a pixel defining layer has a large amount of ink material therein and thus has the organic functional layer with a large thickness formed therein, while a relatively high portion of the bottom surface of the container portion, in which the organic functional layer is to be formed, in the pixel defining layer has a small amount of ink material therein and thus has the organic functional layer with a small thickness formed therein. As a result, when the OLED device is driven to emit light, the light emitted from the OLED device has poor brightness uniformity. Therefore, it is desirable to provide a display substrate, a method for manufacturing the same, and a display device that improve display uniformity of the display substrate.

The display substrate provided by an embodiment of the present disclosure may include an OLED substrate, or may be a display substrate having other types of display elements. In the following embodiments, the display substrate is exemplified as an OLED substrate, i.e., a display element in the display substrate is an OLED device.

In an embodiment, OLED devices can be classified into two types depending on the direction of light emitting from the OLED devices: one type is a bottom emission type OLED device and the other is a top emission type OLED device. Because light is emitted from the top for the top emission type OLED device, the light is not influenced by a driving element at the bottom of the top emission type OLED device, thereby effectively increasing the aperture ratio thereof, and facilitating the integration of the driving circuit at the bottom and the OLED device. Meanwhile, the top emission type OLED device also has the advantages of improving the device efficiency, narrowing the spectrum, improving the color purity, and the like. Therefore, the OLED device is exemplified as the top emission type device in the following embodiments. Alternatively, an OLED device in this embodiment may also be the bottom emission type device.

In an embodiment, a first electrode, an organic functional layer and a second electrode of the OLED device are sequentially disposed on a substrate, the first electrode may be a reflective electrode, and the second electrode may be a transmissive (or transparent) electrode. Further, of the first electrode and the second electrode, one is an anode, and the other is a cathode. For example, the OLED device is the top emission type OLED device, the first electrode is an anode, and the second electrode is a cathode. In an embodiment, the first electrode (i.e., the reflective electrode) may be made of metal having high reflectance, such as Ag, Mg, Al, Cu, and the like, and the second electrode (i.e., the transmissive electrode) may be made of a material having high transmittance, such as indium tin oxide (ITO).

In general, the anode of the OLED device may be connected to a drain of a driving element (e.g., a thin film transistor). Therefore, in order to facilitate connection therebetween, the first electrode may optionally be the anode of the OLED device, and the second electrode may optionally be the cathode of the OLED device. The display substrate and the method for manufacturing the display substrate according to the present disclosure will be described below with reference to exemplary embodiments.

Moreover, "first", "second", and similar terms used herein are not intended to indicate any order, quantity, or importance, but to distinguish one element from another. The term "comprising" or "including", and the like, means that the element or item preceding the term covers the element or item listed after the term and its equivalents, but does not exclude other elements or items. The terms such as "upper", "lower", "left", "right", and the like are used merely for indicating relative positional relationships in the drawings, and when the position or orientation of a described object is changed, the relative positional relationships may also be changed accordingly.

As shown in FIG. 1, an embodiment of the present disclosure provides a display substrate, which may be an OLED substrate. The OLED substrate may include: a substrate 10; a first pixel defining layer 1 on the substrate 10, wherein the first pixel defining layer 1 has a first container portion 11 therein, for example, the first container portion 11 may be disposed to penetrate through the first pixel defining layer 1 along a stacking direction of the first pixel defining layer 1 and the substrate 10, and in some embodiments, the first container portion 11 may be disposed in the first pixel defining layer 1 in the form of a via (e.g., a first via); a planarization pattern 2 filled in the first container portion 11, wherein a surface of the planarization pattern 2 distal to the substrate 10 is flush with a surface of the first pixel defining layer 1 distal to the substrate 10; an anode 3 of the OLED device positioned over the first pixel defining layer 1 and the planarization pattern 2, wherein the anode 3 covers the planarization pattern 2; a second pixel defining layer 4 located on the layer of the anode 3 of the OLED device, wherein a second container portion (e.g., a second via) 41 is disposed in the second pixel defining layer 4 and penetrates through the second pixel defining layer 4 along the stacking direction of the first pixel defining layer 1 and the substrate 10, the second container portion 41 is disposed corresponding to the first container portion 11, for example, an orthogonal projection of the second container portion 41 on the substrate 10 falls within an orthogonal projection of the first container portion 11 on the substrate 10, and the anode 3 is exposed by the second container portion 41; and an organic functional layer 7 disposed in the second container portion 41, and the organic functional layer 7 being in contact with the anode 3 and being electrically connected to the anode 3. In an embodiment, at least a portion of the anode (i.e., the first electrode or the reflective electrode) 3 in contact with the organic functional layer 7 has a uniform thickness and flat upper and lower surfaces to ensure that the organic functional layer 7 formed thereon has a uniform thickness. Generally, an orthographic projection of the region of the driving element (e.g. the thin film transistor 5) in each pixel of the OLED substrate on the substrate 10 and an orthographic projection of the region of the OLED device on the substrate 10 usually at least partially overlap or even completely overlap each other in the case of the top emission type OLED device. In the present embodiment, a portion of the first pixel defining layer 1 corresponding to the region of the OLED device to be formed is provided with the first container portion (e.g. the first via) 11, the planarization pattern 2 is formed in the first container portion 11, and the surface of the planarization pattern 2 distal to the substrate 10 is flush with the surface of the first pixel defining layer 1 distal to the substrate 10. Therefore, the upper surface of the planarization pattern 2 distal to the substrate 10 is flat, and the first electrode formed on the planarization pattern 2 also has a flat surface, so that the organic functional layer 7 of the OLED device in the second accommodation portion 41 of the second pixel defining layer 4 formed on the first electrode subsequently will also be flat and have a uniform thickness, thereby effectively reducing or eliminating the problem of non-uniform light emission of the respective OLED devices in the OLED substrate.

It should be understood that, a first planarization layer 6 may be generally formed on the entire upper surface of the substrate 10, having a large area, and thus the flatness of the upper surface thereof is not high enough. In the present disclosure, the planarization pattern 2 having a small area is formed on the first planarization layer 6 such that the upper surface of the planarization pattern has a sufficiently high flatness. In this way, the organic functional layer 7 formed on the planarization pattern 2 has a uniform thickness, thereby allowing light emitted from the display substrate to have uniform brightness.

In some embodiments, the first container portion 11 and the second container portion 41 may be provided such that an area of the upper surface of each of the first container portion 11 and the second container portion 41 is greater than an area of the lower surface thereof (i.e., each of the first container portion 11 and the second container portion 41 may be provided to have an inverted trapezoid shape). Also, the orthographic projection of the second container portion 41 on the substrate 10 may fall within the orthographic projection of the first container portion 11 on the substrate 10 to ensure that the organic functional layer 7 formed in the second container portion 41 is in contact with only the upper surface of the planarization pattern 2, but not in contact with the upper surface of the first pixel defining layer 1, thereby allowing the organic functional layer 7 to have a more uniform thickness.

In some embodiments, the anode 3 may at least partially cover the surface of the planarization pattern 2 distal to the substrate 10. In some embodiments, the anode 3 may completely cover the surface of the planarization pattern 2 distal to the substrate 10, such that the anode 3 may be sufficiently electrically connected to the organic functional layer 7. In the display substrate according to the present embodiment, the first planarization layer 6 may be further provided on a side of the first pixel defining layer 1 distal to the anode 3 and in contact with the first pixel defining layer 1. Optionally, the area of the first planarization layer 6 formed on the substrate 10 is larger than the area of the first pixel defining layer 1, so that an orthographic projection of the first pixel defining layer 1 on the substrate falls within an orthographic projection of the first planarization layer 6 on the substrate 10. A driving element (e.g., the thin film transistor 5 shown in FIG. 1) is further formed between the substrate 10 and the OLED device, and thus the first planarization layer 6 is formed to perform a planarization process (e.g., a leveling process) on the entire surface of the substrate 10 having the driving element before the OLED device is formed, to ensure the formed planarization pattern 2 to be flat while the planarization pattern 2 is not thick, which is beneficial to lightening and thinning the display substrate.

As described above, the driving element of the display substrate may be the thin film transistor 5. In an embodiment, the thin film transistor 5 may include an active layer 51 on the substrate 10 and a source electrode 52, a drain electrode 53, and a gate electrode 54 over the active layer 51, and the first electrode (i.e., the anode 3) is connected to the drain electrode 53 of the thin film transistor 5 through a third via 12 penetrating through the first pixel defining layer 1 and the first planarization layer 6 in the stacking direction of the first pixel defining layer 1 and the substrate 10. For example, as shown in FIG. 1, portions of the first planarization layer 6 and the first pixel defining layer 1 corresponding to the drain electrode 53 of the thin film transistor 5 are provided with the third via 12, and a material of the anode 3 fills the third via 12 to be electrically connected to the drain electrode 53 of the thin film transistor 5. In addition, the region where the thin film transistor 5 is located at least partially overlaps the region where the OLED device is located. Therefore, the aperture ratio of the display substrate and the resolution of the display substrate can be effectively increased.

Figure 2:
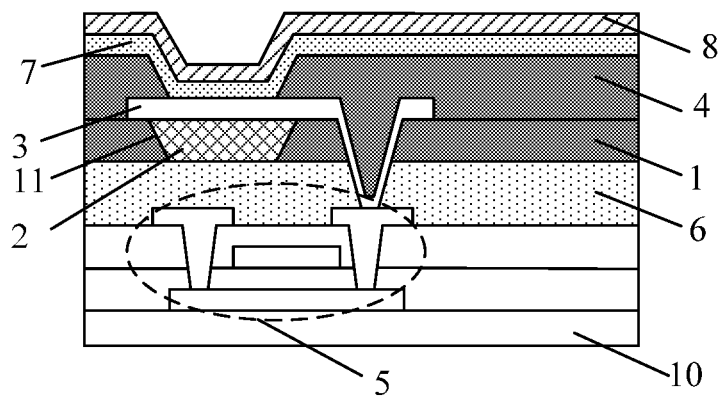
FIG. 2 is a schematic diagram showing an exemplary structure of a display substrate according to an embodiment of the present disclosure.

As shown in FIG. 2, another display substrate is provided by an embodiment of the present disclosure. The structure between the substrate 10 and the second pixel defining layer 4 of the display substrate shown in FIG. 2 may be the same as the structure between the substrate 10 and the second pixel defining layer 4 of the display substrate shown in FIG. 1. Hereinafter, differences of the display substrate of FIG. 2 from the display substrate shown in FIG. 1 will be mainly described. The display substrate of the present embodiment may further include an organic functional layer 7 and a cathode 8 of the OLED device which are arranged at least in the second container portion 41, and the cathode 8 is arranged on a side of the organic functional layer 7 distal to the substrate 10. As shown in FIG. 2, the organic functional layer 7 and the cathode 8 may cover the entire upper surface of the second pixel defining layer 4. For example, the organic functional layer 7 may optionally include a hole injection layer, a hole transport layer, a light emitting layer, an electron transport layer, and an electron injection layer, which are sequentially disposed in a direction away from the substrate 10. In this case, the anode 3 is in contact with and electrically connected to the hole injection layer of the organic functional layer 7, and the cathode 8 is in contact with and electrically connected to the electron injection layer of the organic functional layer 7. In an embodiment, the organic functional layer 7 may include only a light emitting layer disposed in the second container portion 41 and on the upper surface of the second pixel defining layer 4. In an embodiment, the OLED device may include the anode 3, the second pixel defining layer 4, the organic functional layer 7, and the cathode 8.

It should be noted that the pixel defining layers in the OLED substrate of the present embodiment are not limited to two layers, i.e., are not limited to including only the first pixel defining layer 1 and the second pixel defining layer 4. For example, it is feasible that except the last one of the pixel defining layers disposed sequentially in the direction away from the substrate 10, the surface of the planarization pattern 2 in the first container portion 11 of the remaining pixel defining layers distal to the substrate 10 is flush with the surface of the remaining pixel defining layers distal to the substrate 10.

A method for manufacturing the display substrate will be described below, and the structure of the display substrate will be more apparent with reference to the following description.

An embodiment of the present disclosure provides a method for manufacturing a display substrate, and the method may be used for manufacturing the display substrate as described above. The following description will be given by taking the case where the display substrate is an OLED substrate as an example.

In this embodiment, a patterning process may include only a photolithography process, or may include the photolithography process and an etching step. Further, the patterning process may also include other processes for forming a predetermined pattern, such as printing, inkjet printing, and the like. The photolithography process may include processes of film formation, exposure, development, etc., and form a pattern by using a photoresist, a mask, an exposure machine, etc. Various patterning processes may be selected in accordance with the structures formed in an embodiment of the present disclosure.

Figure 3:
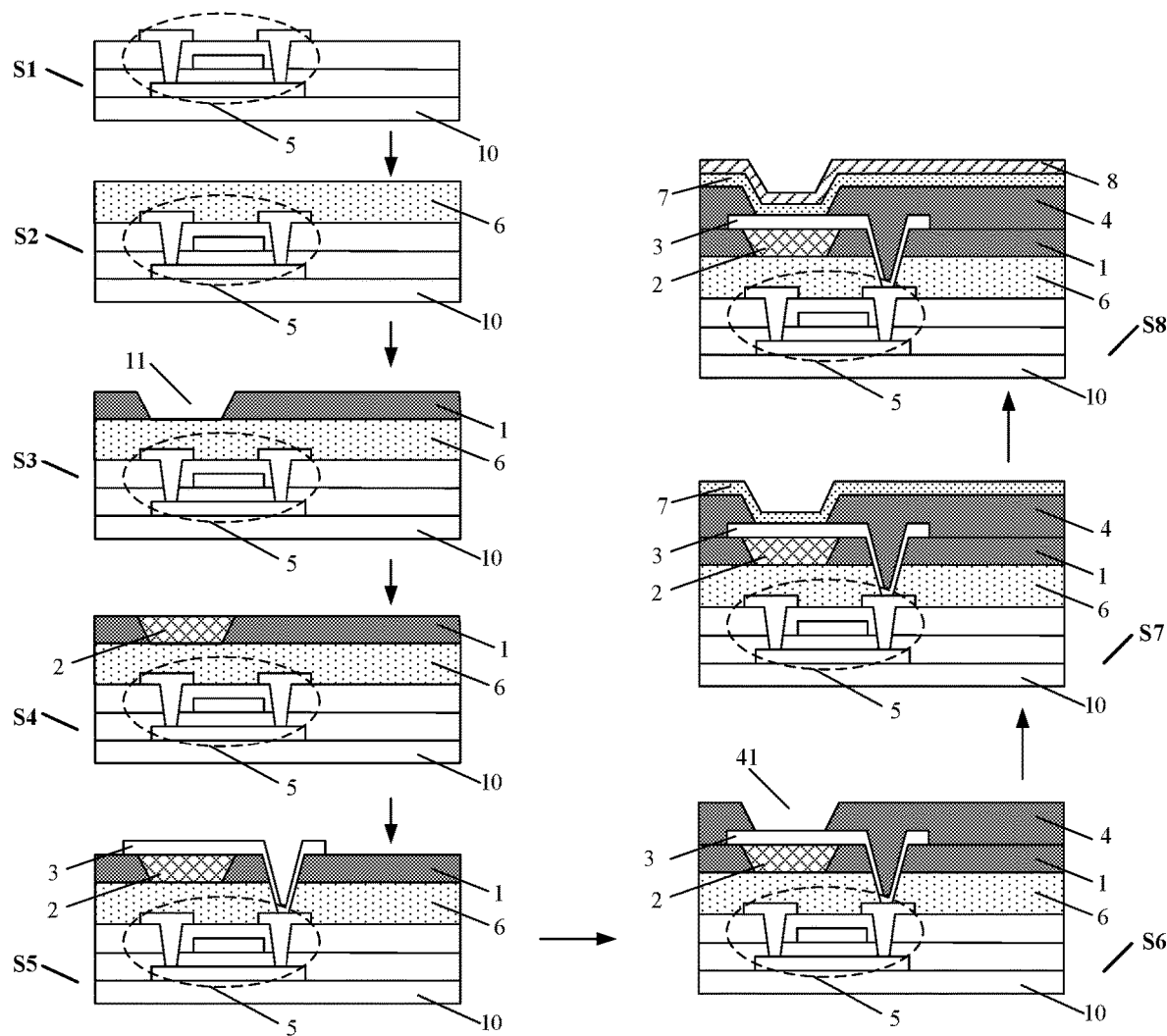
FIG. 3 is a schematic flowchart showing a method for manufacturing a display substrate according to an embodiment of the present disclosure.

As shown in FIG. 3, the method for manufacturing an OLED substrate according to the present embodiment may include the following steps S1 to S8.

In step S1, a driving element for driving each OLED device is formed on the substrate 10. For example, the driving element may include a thin film transistor 5 or the like. The existing processes may be adopted for the steps of forming each layer structure of the thin film transistor 5, and the thin film transistor 5 may be of a top gate type or a bottom gate type. As an exemplary embodiment, a top gate type thin film transistor 5 is illustrated in FIG. 5. The thin film transistor 5 may include an active layer 51, a source electrode 52, a drain electrode 53, and a gate electrode 54 (as shown in FIG. 1), as described above with reference to FIG. 1.

In step S2, a first planarization layer 6 is formed on the driving element.

In this step, for example, the first planarization layer 6 may be formed by spin coating, and at this time, the substrate 10 having the first planarization layer is leveled to complete the present step, to ensure a film formed in a subsequent step to be sufficiently flat and not very thick, which is helpful for lightening and thinning the resultant OLED substrate. In an embodiment, a material of the first planarization layer 6 may include at least one of amide diene, secondary amine diene, secondary amine acrylate, and isocyanate-containing acrylic monomer compound.

In step S3, a first pixel defining layer 1 having a first container portion (e.g., a first via) 11 is formed on the first planarization layer 6 by using a patterning process. That is, the first pixel defining layer 1 has the first container portion 11 therein.

In this step, an entire film structure for the first pixel defining layer 1 may be formed by deposition using a plasma enhanced chemical vapor deposition method, a low pressure chemical vapor deposition method, an atmospheric pressure chemical vapor deposition method, or an electron cyclotron resonance chemical vapor deposition method, and then is subjected to an etching process to form the first pixel defining layer 1 having the first container portion 11 therein. An orthographic projection of the region where the first container portion 11 is located on the substrate 10 and an orthographic projection of the region where the thin film transistor 5 is located on the substrate 10 at least partially overlap each other, which is beneficial to increasing the aperture ratio and the resolution of the display substrate. A material of the first pixel defining layer 1 may be a material well known to one of ordinary skill in the art.

In step S4, a planarization pattern 2 is formed in the first container 11 such that the surface of the planarization pattern 2 distal to the substrate 10 is flush with the surface of the first pixel defining layer 1 distal to the substrate 10.

In this step, a second planarization layer may be formed by using a leveling process, and then the second planarization layer is scraped to form the planarization pattern 2 only in the first container portion 11. A material of the planarization pattern 2 may be the same as that of the first planarization layer 6.

Alternatively, the second planarization layer may also be formed by using the plasma enhanced chemical vapor deposition method, the low pressure chemical vapor deposition method, the atmospheric pressure chemical vapor deposition method, or the electron cyclotron resonance chemical vapor deposition method.

In step S5, a third via 12 penetrating through the first planarization layer 6 and the first pixel defining layer 1 along the stacking direction of the first pixel defining layer 1 and the substrate 10 is formed. Thereafter, an anode 3 of an OLED device is formed by a patterning process such that the anode 3 is connected to the drain electrode 53 of the thin film transistor 5 through the third via 12, and the formed anode 3 of the OLED device covers the planarization pattern 2. In addition, at least a portion of the anode 3 covering the planarization pattern 2 has a uniform thickness and flat upper and lower surfaces.

In step S6, a second pixel defining layer 4 is formed on the first pixel defining layer 1 and the planarization pattern 2 by a patterning process, wherein the second pixel defining layer 4 has a second container portion (e.g., a second via) 41 therein. The second container portion 41 is disposed corresponding to the first container portion 11, for example, an orthographic projection of the second container portion 41 on the substrate 10 falls within an orthographic projection of the first container portion 11 on the substrate 10, and the second container portion 41 exposes the anode 3.

The process of forming the second pixel defining layer 4 in this step may be the same as the process of forming the first pixel defining layer 1, and detailed description thereof will not be repeated. Alternatively, if the second pixel defining layer 4 to be formed has a large thickness, the second pixel defining layer 4 may be formed by a coating process.

In step S7, after forming the second container portion 41, an organic functional layer 7 of the OLED device may be formed in the second container portion 41 and/or on the second pixel defining layer 4 by inkjet printing. However, the present disclosure is not limited to forming the organic functional layer 7 by inkjet printing. In an embodiment, the organic functional layer 7 may optionally include a hole injection layer, a hole transport layer, a light emitting layer, an electron transport layer, and an electron injection layer, which are sequentially disposed in the direction away from the substrate 10. In an embodiment, the organic functional layer 7 may include only the light emitting layer.

In this way, since the surface of the planarization pattern 2 is flat, the surface of the anode 3 formed in step S5 is also flat, and thus the organic functional layer 7 formed in step S7 is also flat, thereby effectively solving the problem of non-uniform light emission of the display substrate.

It should be noted that, the organic functional layer 7 formed in step S7 may be located not only in a separate second container portion 41, but also cover the second container portions 41 located in the same row or the same column, and also cover the second container portions 41 in the whole display substrate. The formation method of the organic functional layer 7 may be determined according to the practical application of the display substrate.

In step S8, a cathode 8 of each OLED device may be formed on the organic functional layer 7 by vapor deposition. For example, the cathodes 8 of the OLED devices may be optionally formed into an integral (or one-piece) structure, such that the control of the cathodes 8 is convenient, and the process thereof is simplified.

In the display substrate and the method for manufacturing the same according to the embodiments of the present disclosure, since the orthographic projection of the region where the driving element (e.g., the thin film transistor 5) is located in each pixel of the display substrate on the substrate 10 and the orthographic projection of the region where the OLED device is located on the substrate 10 at least partially overlap each other or even completely overlap each other, in the case of the top emission type OLED device, the aperture ratio of the display substrate may be increased. In addition, the first container portion 11 is formed in the first pixel defining layer 1 at a position corresponding to a region in which the OLED device is to be formed, the first container portion 11 is filled with the planarization pattern 2, and the surface of the planarization pattern 2 distal to the substrate 10 is flush with the surface of the first pixel defining layer 1 distal to the substrate 10. Therefore, the first electrode formed on the planarization pattern 2 also has a flat surface. In this way, the organic functional layer 7 of the OLED device subsequently formed in the second container 41 is also flat and uniform, thereby effectively reducing or eliminated the problem of non-uniform light emission of each OLED device in the display substrate.

An embodiment of the present disclosure provides a display device, and the display device may include the display substrate shown in FIG. 1 or 2 as described above.

For example, the display device may be a liquid crystal display device or an electroluminescent display device, or any other product or component with a display function such as a liquid crystal panel, electronic paper, an OLED panel, a mobile phone, a tablet computer, a television, a display, a notebook computer, a digital photo frame, and a navigator.

The light emitting layer in the display device according to the present embodiment has a uniform thickness, and thus the display device has better display quality.

It is to be understood that the above embodiments are merely exemplary embodiments for explaining the principles of the present disclosure, and the present disclosure is not limited thereto. It will be apparent to one of ordinary skill in the art that various changes and modifications may be made therein without departing from the spirit and essence of the present disclosure, and these changes and modifications also fall within the scope of the present disclosure.

What is claimed is:

1. A display substrate, comprising:
    a substrate;
    a first pixel defining layer on the substrate, wherein the first pixel defining layer has a first container portion therein;
    a planarization pattern filled in the first container portion, wherein the planarization pattern is in direct contract with the first pixel defining layer, and a surface of the planarization pattern distal to the substrate and a surface of the first pixel defining layer distal to the substrate lie in a same plane;
    a second pixel defining layer on a side of the planarization pattern distal to the substrate, wherein a second container portion is in the second pixel defining layer and penetrates through the second pixel defining layer along a stacking direction of the first pixel defining layer and the substrate, and an orthographic projection of the second container portion on the substrate falls within an orthographic projection of the first container portion on the substrate; and
    an organic functional layer in the second container portion.

2. The display substrate of claim 1, further comprising a first electrode between the planarization pattern and the organic functional layer, wherein the first electrode covers the planarization pattern.

3. The display substrate of claim 1, further comprising a first planarization layer, wherein the first planarization layer is provided at a side of the first pixel defining layer proximal to the substrate and in contact with the first pixel defining layer.

4. The display substrate of claim 3, wherein an orthographic projection of the first pixel defining layer on the substrate falls within an orthographic projection of the first planarization layer on the substrate.

5. The display substrate of claim 2, further comprising a second electrode on a side of the organic functional layer distal to the substrate.

6. The display substrate of claim 5, wherein the display substrate comprises an OLED substrate, the first electrode is a reflective electrode, and the second electrode is a transmissive electrode.

7. The display substrate of claim 6, further comprising a thin film transistor between the substrate and the first pixel defining layer, wherein an orthographic projection of a region where the thin film transistor is located on the substrate at least partially overlaps an orthographic projection of a region where the first electrode, the second electrode, and the organic functional layer are located on the substrate.

8. The display substrate of claim 1, wherein the first container portion is a first via penetrating through the first pixel defining layer along the stacking direction of the first pixel defining layer and the substrate.

9. The display substrate of claim 1, wherein the second container portion is a second via penetrating through the second pixel defining layer along the stacking direction of the first pixel defining layer and the substrate.

10. The display substrate of claim 7,
further comprising a first planarization layer, wherein the first planarization layer is provided at a side of the first pixel defining layer proximal to the substrate and in contact with the first pixel defining layer; and
wherein the thin film transistor comprises an active layer on the substrate and a source electrode and a drain electrode on the active layer, and the first electrode is connected to the drain electrode through a third via penetrating through the first pixel defining layer and the first planarization layer along the stacking direction of the first pixel defining layer and the substrate.

11. A display device comprising the display substrate of claim 1, wherein the display device is an electroluminescent display device.

* * * * *